US009570645B2

United States Patent
Zhao et al.

(10) Patent No.: US 9,570,645 B2
(45) Date of Patent: Feb. 14, 2017

(54) PHOTODIODE AND METHOD OF MANUFACTURING THE SAME, AND X-RAY DETECTOR AND METHOD OF MANUFACTURING THE SAME

(71) Applicant: BOE TECHNOLOGY GROUP CO., LTD., Beijing (CN)

(72) Inventors: Lei Zhao, Beijing (CN); Wei Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/890,587

(22) PCT Filed: Mar. 25, 2015

(86) PCT No.: PCT/CN2015/075030
§ 371 (c)(1),
(2) Date: Nov. 11, 2015

(87) PCT Pub. No.: WO2016/082391
PCT Pub. Date: Jun. 2, 2016

(65) Prior Publication Data
US 2016/0359075 A1    Dec. 8, 2016

(30) Foreign Application Priority Data
Nov. 26, 2014 (CN) .......................... 2014 1 0696940

(51) Int. Cl.
*H01L 27/146* (2006.01)
*H01L 31/105* (2006.01)
(Continued)

(52) U.S. Cl.
CPC ............. *H01L 31/105* (2013.01); *G01T 1/241* (2013.01); *H01L 27/14658* (2013.01);
(Continued)

(58) Field of Classification Search
CPC ............. H01L 31/105; H01L 27/14658; H01L 27/14663
See application file for complete search history.

(56) References Cited

U.S. PATENT DOCUMENTS 7,470,910 B2    12/2008   Spahn
7,728,329 B2 *   6/2010   Joo ..................... H01L 27/1214
                                                    257/59
(Continued)

FOREIGN PATENT DOCUMENTS

CN      101509977 A      8/2009
CN      101740659 A      6/2010
(Continued)

OTHER PUBLICATIONS

Second Chinese Office Action, for Chinese Patent Application No. 2014106969409, dated Jul. 4, 2016, 15 pages.
(Continued)

*Primary Examiner* — Evan Pert
(74) *Attorney, Agent, or Firm* — Kinney & Lange, P.A.

(57) ABSTRACT

A photodiode and a method of manufacturing the same, and an X-ray detector and a method of manufacturing the same are provided. The PIN photodiode includes a first doped layer, a second doped layer and an intrinsic layer between the first and second doped layers, the first doped layer is provided on a source/drain electrode layer of a thin film transistor of the X-ray detector. A heavily-doped region is provided in the second doped layer, has a dosage concentration larger than that of the second doped layer, and is electrically connected with a cathode of the PIN photodiode.

20 Claims, 2 Drawing Sheets

(51) Int. Cl.
*H01L 31/18* (2006.01)
*G01T 1/24* (2006.01)

(52) U.S. Cl.
CPC ........ *H01L 27/14663* (2013.01); *H01L 31/18* (2013.01); *H01L 31/1864* (2013.01)

(56) References Cited

U.S. PATENT DOCUMENTS

| | | | | |
|---|---|---|---|---|
| 7,767,974 | B2* | 8/2010 | Jung | H01L 27/14663 250/370.09 |
| 7,964,903 | B2* | 6/2011 | Joo | H01L 27/1214 257/292 |
| 7,985,954 | B2* | 7/2011 | Jung | G01T 1/2018 250/370.09 |
| 8,106,364 | B2* | 1/2012 | Jung | G01T 1/2018 250/208.1 |
| 8,299,465 | B2* | 10/2012 | Jung | H01L 27/1461 257/53 |
| 8,324,624 | B2* | 12/2012 | Jung | H01L 27/14632 257/350 |
| 8,558,185 | B2* | 10/2013 | Tredwell | H01L 27/14603 250/370.08 |
| 8,921,856 | B2* | 12/2014 | Tang | H01L 31/1055 257/290 |
| 2009/0140263 | A1 | 6/2009 | Umezawa et al. | |

FOREIGN PATENT DOCUMENTS

| | | |
|---|---|---|
| CN | 101752445 A | 6/2010 |
| CN | 102110724 A | 6/2011 |
| CN | 102315317 A | 1/2012 |
| CN | 102544024 A | 7/2012 |
| CN | 102751302 A | 10/2012 |
| CN | 102856441 A | 1/2013 |
| CN | 103219431 A | 7/2013 |
| CN | 104393092 A | 3/2015 |

OTHER PUBLICATIONS

Third Chinese Office Action for Chinese Patent Application No. 2014106969409, dated Aug. 17, 2016, 17 pages.
Rejection Decision for Chinese Patent Application No. 2014106969409, dated Oct. 17, 2016.
First Chinese Office Action including English translation for Chinese Patent Application No. 201410696940.9, dated Feb. 3, 2016.
International Search Report and Written Opinion and its English translation dated Aug. 26, 2015, for PCT/CN2015/075030.

* cited by examiner

PHOTODIODE AND METHOD OF MANUFACTURING THE SAME, AND X-RAY DETECTOR AND METHOD OF MANUFACTURING THE SAME

CROSS-REFERENCE TO RELATED APPLICATION

This application is a Section 371 National Stage Application of International Application No. PCT/CN2015/075030, filed 25 Mar. 2015, entitled "PHOTODIODE AND METHOD OF MANUFACTURING THE SAME, AND X-RAY DETECTOR AND METHOD OF MANUFACTURING THE SAME", which has not yet published, and which claims priority to Chinese Application No. 201410696940.9, filed on 26 Nov. 2014, incorporated herein by reference in their entirety.

BACKGROUND OF THE INVENTION

Field of the Invention

Embodiments of the present disclosure generally relate to the field of semiconductor technologies, and particularly, to a photodiode and a method of manufacturing the same, and an X-ray detector and a method of manufacturing the same.

Description of the Related Art

X-ray detection technologies are widely applied in fields such as medical treatment, security, non-destructive inspection, scientific research and the like, and increasingly play important roles in the national economy and the people's livelihood. Currently, film radiography is generally utilized in actual X-ray detection. The X-ray film radiography technology has a high imaging quality, and can correctly provide reliable information about appearance and defects of a test sample. This technology, however, has disadvantages such as complex operation, high running cost, difficulty in saving a result, inconvenience in retrieving the result, poor portability, and damage to eyes of a reviewer due to strong light, and the like.

In order to solve the above, an X-ray digital radiography (DR) detection technology was developed in the late 1990s. An X-ray digital radiography system is provided with a flat panel detector, which has a pixel size that may be less than 0.1 mm, and thus has an imaging quality and a resolution which can be almost comparable with the film radiography technology, while overcoming the defects present in the film radiography technology and providing convenience in computer processing of images. The digital X-ray radiography detection technologies may be classified, according to different electron conversion modes, into a direct conversion type (Direct DR) and an indirect conversion type (Indirect DR).

The direct conversion type X-ray flat panel detector is comprised of a ray receiver, a command processor and a power supply. The ray receiver comprises a scintillation crystal ($Gd_2O_2S$ or CsI) panel, a large area amorphous silicon sensor array, a readout circuit, and the like. The scintillation crystal panel is used to convert X-ray photons into visible light, and the large-scale integrated amorphous silicon sensor array jointed closely to the scintillation crystal panel is used to convert the visible light from the panel into electrons, which will then be digitalized by the readout circuit and transmitted to a computer so as to form a displayable digital image.

The indirect conversion type detector is comprised of an X-ray conversion layer, an amorphous silicon photodiode, a thin film transistor, basic pixel units for signal storage, signal amplifying and readout circuits, and the like. The indirect conversion type flat panel detector has a configuration mainly comprised of a scintillator (cesium iodide) or phosphor (gadolinium oxysulfide) layer, an amorphous silicon layer functioning as a photodiode and a TFT array. The scintillator or phosphor layer of such flat panel detector can, after being exposed to X-ray, convert the X-ray into an electrical signal, and a charge signal from each pixel is readout by the thin film transistor array and is converted into a digital signal, which will be transmitted to an image processing system of the computer to be integrated into an X-ray image.

The PIN photodiode is a critical component of an indirect conversion type X-ray detection substrate, is a decisive factor for absorption efficiency of the visible light, and has great influences on key indicators such as X-ray dosage, X-ray imaging resolution, image response speed and the like. Processes of manufacturing the PIN photodiode of the indirect conversion type X-ray detection substrate mainly include PECVD (plasma activated chemical vapor deposition) and ion implantation, where PIN devices may be formed conveniently and quickly by using different process gases (for example, $SiH_4$, $NH_3$, $N_2O$, $PH_3$, $H_2$, $B_2H_6$, and the like) in the PECVD technology at the same time, the PECVD technology, however, is disadvantageous in that the dosage concentration is constant, doping of a particular region cannot be achieved, and an ion implantation technologies is required to cooperate with the PECVD technology in order to improve performances of the PIN devices.

In view of the above, there is a need to provide a new photodiode and a method of manufacturing the same, and an X-ray detector and a method of manufacturing the same, which can at least partially solve the above problems.

SUMMARY

An object of the present disclosure is aimed to solve at least one of the above problems and defects.

According to one aspect of the present disclosure, there is provided a PIN photodiode for an X-ray detector, the X-ray detector comprising a thin film transistor comprising a gate, a gate insulation layer, an active layer and a source/drain electrode layer arranged in stack in order on a substrate, the PIN photodiode comprising a first doped layer, a second doped layer and an intrinsic layer between the first and second doped layers stacked in order, and the first doped layer being provided on the source/drain electrode layer, wherein a heavily-doped region is provided in the second doped layer, has a doping concentration larger than that of the second doped layer, and is electrically connected with a cathode of the PIN photodiode.

In the above PIN photodiode, the heavily-doped region may be arranged in a grid shape, and the cathode may be arranged in a grid shape matching that of the heavily-doped region.

In the above PIN photodiode, a surface of the second doped layer facing the cathode may be provided with a textured structure.

In the above PIN photodiode, the textured structure may be formed by isotropically etching the surface of the second doped layer by using a dry etching process.

In the above PIN photodiode, the first doped layer may be an n+ α-Si:H layer, the intrinsic layer may be an α-Si:H layer, the second doped layer may be a p+ α-Si:H layer, and the heavily-doped region may be a p++ α-Si:H layer; or the second doped layer may be an n+ α-Si:H layer, the intrinsic layer may be an α-Si:H layer, the first doped layer may be a p+ α-Si:H layer, and the heavily-doped region may be an n++ α-Si:H layer.

In the above PIN photodiode, the heavily-doped region may be formed through an ion implantation process.

In the above PIN photodiode, the heavily-doped region may have a shape of groove, the groove is formed in the intrinsic layer and the second doped layer, and a portion of the cathode is arranged within the groove.

In the above PIN photodiode, $B_2H_6$ or $PH_3$ may be used as an ion source for doping in the ion implantation process.

According to another aspect of the present disclosure, there is provided a method of manufacturing the above PIN photodiode, comprising steps of:

providing a substrate, on which a thin film transistor for the X-ray detector has been formed, thin film transistor comprising a gate, a gate insulation layer, an active layer and a source/drain electrode layer arranged in stack in order on the substrate;

depositing a plurality of layers of the PIN photodiode on a side of the source/drain electrode layer away from the active layer and patterning the plurality of layers, the plurality of layers comprising a first doped layer, a second doped layer and an intrinsic layer between the first and second doped layers, the first doped layer being providing on the source/drain electrode layer;

forming a heavily-doped region having a grid shape, the heavily-doped region contacting the second doped layer;

performing annealing activation treatment so as to activate doped ions;

depositing a passivation layer on the substrate to at least cover the thin film transistor and the second doped layer, and patterning the passivation layer so as to form a through hole at a position in the passivation layer corresponding to the heavily-doped region; and depositing a cathode material layer on the passivation layer above the second doped layer and patterning the cathode material layer so as to form a cathode having a grid shape, a portion of the cathode being arranged within the through hole so that the cathode electrically contacts or is electrically connected with the heavily-doped region.

In the above method, the step of forming a heavily-doped region having a grid shape may comprise heavily doping the second doped layer by using an ion implantation process so that the heavily-doped region is formed in the second doped layer.

In the above method, the step of forming a heavily-doped region having a grid shape may comprise: patterning the intrinsic layer and the second doped layer so as to form a groove penetrating through the intrinsic layer and being partially located in the second doped layer; and heavily doping the groove by using an ion implantation process so as to form the heavily-doped region in a form of groove.

In the above method, the step of patterning the plurality of layers of the PIN photodiode may comprise coating, developing, postbaking photoresist and performing a dry etching process so as to pattern the plurality of layers, and stripping the photoresist.

In the above method, the first doped layer and the second doped layer of the PIN photodiode may be formed respectively by using an ion implantation process.

In the above method, an α-Si:H layer may be deposited through a PECVD process, and is doped by using $B_2H_6$ or $PH_3$ as an ion source so as to form a P+ α-Si:H layer or an N+ α-Si:H layer as the first doped layer; and then an α-Si:H layer is deposited through a PECVD process, and is partially doped by using $PH_3$ or $B_2H_6$ as an ion source so as to form an N+ α-Si:H layer or a P+ α-Si:H layer as the second doped layer with an undoped portion of the α-Si:H layer being used as the intrinsic layer.

In the above method, thicknesses of the first doped layer and the second doped layer may be 200 Å~700 Å respectively, and a thickness of the intrinsic layer may be 5000 Å~15000 Å.

According a further aspect of the present disclosure, there is provided an X-ray detector, comprising: a substrate; a thin film transistor formed on the substrate, the thin film transistor comprising a gate, a gate insulation layer, an active layer and a source/drain electrode layer arranged in stack in order on the substrate; the above PIN photodiode; and a scintillant material layer at least covering the PIN photodiode.

According a still further aspect of the present disclosure, there is provided a method of manufacturing the above X-ray detector, comprising: forming the thin film transistor on the substrate; forming the PIN photodiode by the above method; and forming the scintillant material layer to at least cover the PIN photodiode and performing a packaging process.

BRIEF DESCRIPTION OF THE DRAWINGS

These and/or other aspects and advantages of the present disclosure will become more apparent and will be understood more clearly though the following description of preferred embodiments made with reference to the accompanying drawings, in which.

DETAILED DESCRIPTION OF PREFERRED EMBODIMENTS OF THE INVENTION

Exemplary embodiments of the present disclosure will be described hereinafter in detail with reference to FIGS. 1-3. In the description, the like reference numbers refer to the like elements. The description of embodiments of the present disclosure made with reference to the attached drawings is intended to illustrate general inventive concepts of the present invention, and should not be construed as being limitative to the present invention.

Figure 1:
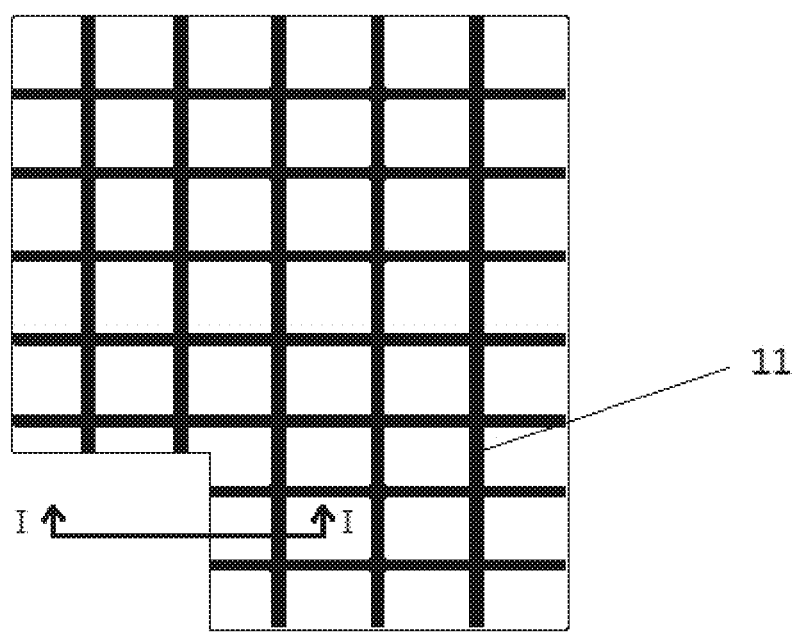
FIG. 1 is a schematic diagram of a metal cathode in a grid shape of a PIN photodiode according to an embodiment of the present disclosure.
Figure 2:
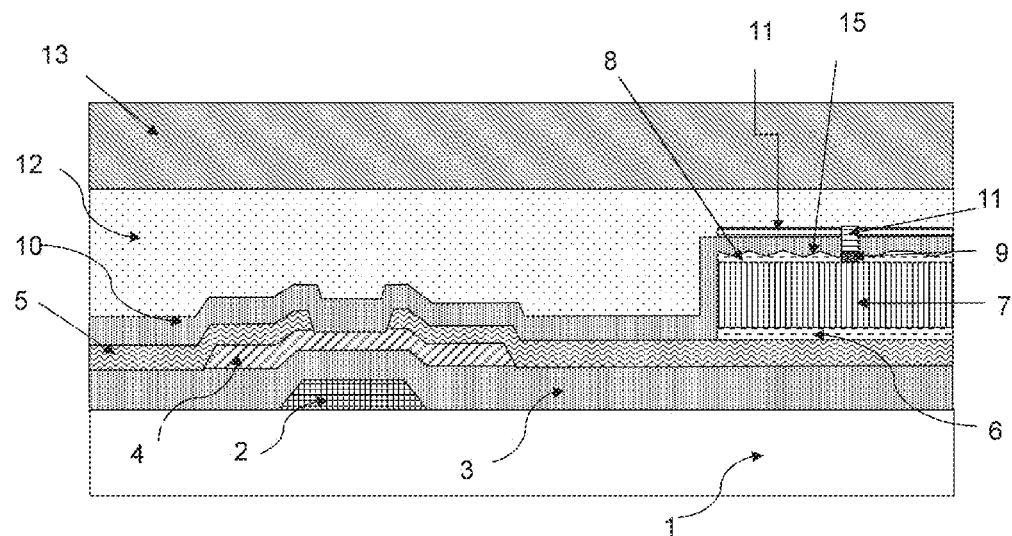
FIG. 2 is a sectional schematic diagram of an X-ray detector according to one embodiment of the present disclosure, taken along a line I-I in FIG. 1.

As shown in FIGS. 1 and 2, illustrated are structural schematic diagrams of a PIN photodiode and an X-ray detector using the PIN photodiode according to one embodiment of the present disclosure.

As described above, the X-ray detector of the present disclosure mainly indicates an indirect conversion type detector. The X-ray detector comprises components such as an X-ray conversion layer, an amorphous silicon photodiode, a thin film transistor, basic pixel units for signal storage, signal amplifying and signal readout circuits, and the like. Improvements of the present disclosure are based on the PIN photodiode for the X-ray detector and corresponding structure thereof, thus figures of the present disclosure only show the PIN photodiode for the X-ray detector and the corresponding structure thereof, with other associated parts being omitted for purpose of conciseness. The arrangement of the above components could be obtained by those skilled in the art from prior arts, and thus are not again described in detail.

As shown in FIG. 2, the PIN photodiode comprises a first doped layer 6, a second doped layer 8 and an intrinsic layer 7 between the first and second doped layers 6, 8, the first doped layer 6 is provided on the source/drain electrode layer 5 (for example, on a drain electrode) of the thin film transistor of the X-ray detector, and the second doped layer 8 is electrically connected with a cathode 11 of the PIN photodiode. A heavily-doped region 9 is provided in the second doped layer 8 and has a dosage concentration larger than that of the second doped layer 8.

According to one embodiment of the present disclosure, the heavily-doped region 9 is arranged in a grid shape, and as shown in FIG. 1, the cathode 11 is arranged in a grid shape matching that of the heavily-doped region 9. That is, the heavily-doped region 9 and the cathode 11 are arranged to have the same grid shape, and a portion of the cathode 11 is directly arranged on the heavily-doped region 9. Since the cathode 11 is formed as the grid shape, the cathode 11 can function to reduce reflected X-rays compared to a plate-like cathode in prior art.

Thin film transistor is arranged at a vacancy at a lower and left corner shown in FIG. 1; as shown in FIG. 2, thin film transistor comprises a gate 2, a gate insulation (GI) layer 3, an active layer 4 and a source/drain electrode layer 5 arranged in stack in order on a substrate 1, and a passivation layer 10 covers the thin film transistor. A resin layer 12 and a scintillant layer 13 are also provided on the substrate 1 to cover the thin film transistor and the PIN photodiode. The passivation layer 10 also cover the second doped layer 8, and the cathode 11 is formed on the passivation layer 10 and is electrically connected with the second doped layer 8 through a through hole in the passivation layer 10.

Further, as indicated by a wave line shown in FIG. 2, a surface of the second doped layer 8 facing the cathode 11 is provided with a textured or concave-convex structure 15. In one example of the present disclosure, the surface of the second doped layer 8 is isotropically etched by using a dry etching process to form the textured or concave-convex structure 15. According to embodiments of the present disclosure, use of the textured or concave-convex structure can increase possibility of total reflection of X-rays at an interface position, and enhance absorption of X-rays by the PIN photodiode device. It will be understood that the surface of the second doped layer 8 facing the cathode 11 may be provided with other non-planar or coarse structures for facilitating absorption of X-rays.

In one example, the first doped layer 6 is an n+ α-Si:H layer, the intrinsic layer 7 is an α-Si:H layer, the second doped layer 8 is a p+ α-Si:H layer, and the heavily-doped region 9 is a p++ α-Si:H region or layer. Alternatively, the second doped layer 8 is an n+ α-Si:H layer, the intrinsic layer 7 is an α-Si:H layer, the first doped layer 6 is a p+ α-Si:H layer, and the heavily-doped region 9 is an n++ α-Si:H region or layer.

An example of a process of manufacturing an X-ray detector of the present disclosure will be described with reference to FIG. 2. In the example, a method of manufacturing the X-ray detector comprises the followings steps:

step 1: cleaning a glass substrate 1 firstly; depositing a metal gate layer (a thickness of metal gate layer is a generally two to three times of a depth of a groove (described below) of the cathode); coating, exposing, developing and postbaking photoresist on the metal gate layer and performing an etching process so as to pattern the metal gate layer, and then stripping the photoresist, finally forming a gate 2 having a predetermined pattern shown in the figures;

step 2: depositing a gate insulation (GI) layer 3; depositing an active layer 4 (for example, α-Si:H, LTPS, IGZO, ITZO, ZnON); coating, exposing, developing and postbaking photoresist on the active layer 4 and performing an etching process so as to pattern the active layer 4, and then stripping the photoresist; depositing a source/drain electrode layer 5 (S/D electrode layer);

step 3: depositing a plurality of layers of the PIN photodiode (respectively, an N+ α-Si:H layer 6 having a thickness of 200~700 Å, an intrinsic layer 7 (α-Si:H) having a thickness of 5000 Å~15000 Å, a P+ α-Si:H layer 8 having a thickness of 200 Å~700 Å), and coating, exposing, developing and postbaking photoresist on the plurality of layers of the PIN photodiode and performing a dry etching process so as to pattern the plurality of layers of the PIN photodiode, then stripping the photoresist;

step 4: isotropically etching a surface of the PIN photodiode (specifically, a surface of the second doped layer 8 away from the intrinsic layer 7, that is, a surface of the second doped layer 8 facing a cathode 11 to be formed subsequently) by a dry etching process so as to achieve a textured non-planar surface (to obtain a textured or concave-convex structure 15);

step 5: coating, exposing, developing and postbaking photoresist on the second doped layer 8 of the PIN photodiode so as to pattern the photoresist, and heavily doping to the second doped layer with a large dosage of P++ by using an ion implantation process (using $B_2H_6$ as a process gas) so as to form a heavily-doped region 9 having a grid shape, and then stripping the photoresist;

step 6: performing annealing activation treatment (for example, high temperature annealing, or rapid thermal annealing) on the whole of the formed substrate so as to activate doped ions;

step 7: coating, exposing, developing and postbaking photoresist on the S/D electrode layer 5 and performing an etching process so as to pattern the S/D electrode layer 5, and then stripping the photoresist; it will be appreciated that the S/D electrode layer may be patterned after depositing a source/drain electrode layer and before depositing respective layers of the PIN photodiode;

step 8: depositing a passivation (PVX) layer 10 (for example, $Si_xN_y$, $Al_xO_y$, $TiO_2$), coating, exposing, developing and postbaking photoresist on the PVX layer, and etching the PVX layer at a position corresponding to the heavily-doped region 9 so as to form a through hole penetrating the PVX layer and having a grid shape, then stripping the photoresist;

step 9: depositing a metal cathode layer (for example, Mo, Al, Ti, Cu, Nd), coating, exposing, developing and postbaking photoresist on the metal cathode layer and performing an etching process so as to form a metal cathode 11 having a grid shape, then stripping the photoresist; a portion of metal cathode 11 fills the through hole in the passivation layer 10 so as to contact the heavily-doped region 9;

step 10: coating, exposing, developing and postbaking a resin layer 12 so as to pattern the resin layer 12; evaporating a scintillant material layer 13, and packaging the whole device, finally completing manufacturing of the X-ray detector.

Figure 3:
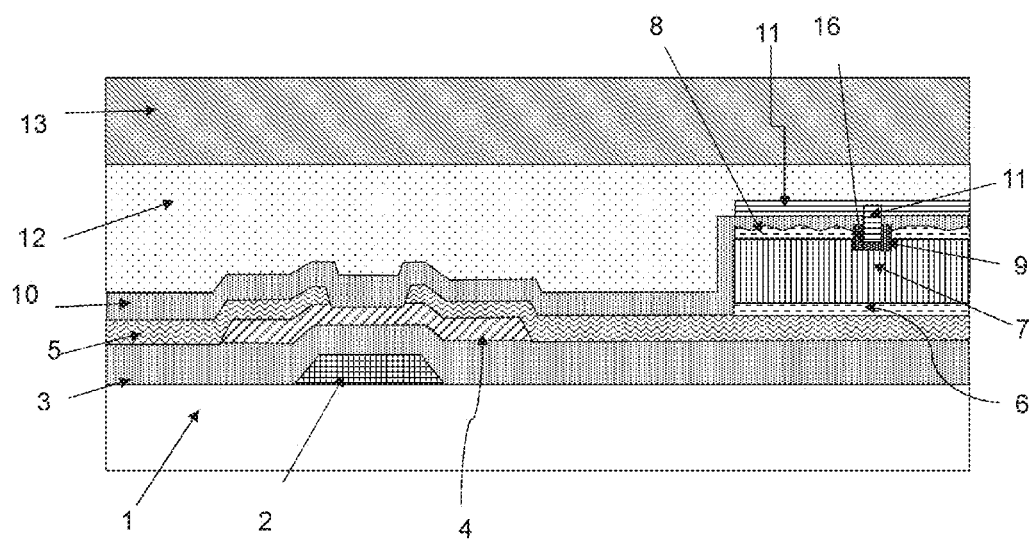
FIG. 3 is a sectional schematic diagram of an X-ray detector according to another embodiment of the present disclosure, taken along a line I-I in FIG. 1.

Although in the configuration shown in FIG. 2, the heavily-doped region 9 is formed through an ion implantation process, the heavily-doped region 9 may be formed through an ion implantation process after the intrinsic layer and the second doped layer of the PIN photodiode are patterned to form a groove 16 therein, and a portion of the cathode 11 is arranged within the groove 16, as described below and as shown in FIG. 3.

With reference to FIG. 3, only differences in configuration and manufacturing processes between FIG. 3 and FIG. 2 will be described in detail, and the same is not described again.

Processes of manufacturing the configuration shown in FIG. 3 are different in steps 3 and 5, which, for example, are replaced with the following steps 3' and 5':

step 3': depositing respective layers of the PIN photodiode (respectively, an N+ α-Si:H layer 6 having a thickness of 200 Å~700 Å, an intrinsic layer 7 (Intrinsic α-Si:H) having a thickness of 5000 Å~15000 Å, and a P+ α-Si:H layer 8 having a thickness of 200 Å~700 Å), and coating, exposing, developing and postbaking photoresist on the respective layers of the PIN photodiode and performing dry etching processes so as to pattern the respective layers of the PIN photodiode, then stripping the photoresist;

step 5': coating, exposing, developing and postbaking photoresist on the intrinsic layer and the second doped layer of the PIN photodiode and dry etching the intrinsic layer and the second doped layer so as to form a cathode groove 16 (the groove having a depth larger than the thickness of the N+ α-Si:H layer), and heavily doping to the cathode groove 16 with a large dosage of P++ by using an ion implantation process (using $PH_3$ as a process gas) so as to form a groove-like heavily-doped region 9, and then stripping the photoresist.

In another alternative embodiment, the processes of manufacturing the PIN photodiode in the above step 3 may be replaced with an ion implantation process. Specifically, an α-Si:H layer having a thickness of 200 Å~700 Å may be deposited by using a PECVD process, and is doped through an ion implantation process by using $PH_3$ or $B_2H_6$ as an ion source so as to form a P+ α-Si:H layer or an N+ α-Si:H layer; then, an α-Si:H layer having a thickness of 5000 Å~15000 Å or more may be deposited by using a PECVD process, and is doped through an ion implantation process by using $B_2H_6$ or $PH_3$ as an ion source so as to form an N+ α-Si:H layer or a P+ α-Si:H layer having a thickness of 200 Å~700 Å.

Embodiments of the present disclosure mainly utilize PECVD technologies to manufacture the PIN photodiode, and provide feasible technique solutions which combines technologies such photolithography, dry etching, PECVD, ion implantation and the like so as to modify configurations of existing PIN devices and to achieve improvement in performances of the PIN devices.

According to embodiments of the present disclosure, there are provided a novel PIN photodiode device and a method of manufacturing the same, which provides the whole PIN photodiode device with a textured or concave-convex structure by using a dry etching process.

According to embodiments of the present disclosure, the textured or concave-convex structure of the PIN photodiode device can increase possibility of total reflection of X-rays at an interface position, and enhance absorption of X-rays by the PIN photodiode device; combination of the textured structure and the grid shaped metal cathode of PIN photodiode device increases the light absorption rate of the PIN photodiode through the total reflection principle, improves a surface defect density of PIN photodiode device, and increases the photoelectric conversion efficiency of the PIN device.

Hereinafter, the total reflection principle will be described in brief: the total reflection is a phenomenon where light is totally reflected back into initial medium when the light is incident onto an interface of an optically thinner medium (having a small refractive index for light) from an optically denser medium (having a large refractive index for light). The refractive index of an amorphous silicon film manufactured through PECVD process is typically in a range of 3.2~4.0, depending on process conditions; among materials of the passivation layer or antireflection layer used in embodiments of the present disclosure, the refractive index of SiNx film is generally in a range of 1.7~3.0, the refractive index of $Al_2O_3$ film is generally 1.7, the refractive index of $TiO_2$ film is generally 2.4, all of which facilitate better total reflection when a suitable surface appearance is formed.

Further, according to embodiments of the present disclosure, the surface of the PIN photodiode device is heavily doped by using ion implantation or PECVD technologies so as to a grid shaped heavily-doped region, which reduces surface resistance; with removal of a transparent cathode layer, the metal cathode formed into a grid shape, when compared to a plate-like cathode in prior art, can reduce reflected X-ray, increase light absorption rate of photon-generated carriers, and improve performances of the PIN photodiode device, while reducing manufacturing processes and decreasing production cost.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A PIN photodiode for an X-ray detector, the PIN photodiode comprising a first doped layer, a second doped layer and an intrinsic layer between the first and second doped layers stacked in order, and the first doped layer being provided on a source/drain electrode layer of a thin film transistor of the X-ray detector, wherein
    a heavily-doped region is provided in the second doped layer, has a doping concentration larger than that of the second doped layer, and is electrically connected with a cathode of the PIN photodiode.

2. The PIN photodiode according to claim 1, wherein the heavily-doped region is arranged in a grid shape, and the cathode is arranged in a grid shape matching that of the heavily-doped region.

3. The PIN photodiode according to claim 1, wherein a surface of the second doped layer facing the cathode is provided with a textured structure.

4. The PIN photodiode according to claim 3, wherein the textured structure is formed by isotropically etching the surface of the second doped layer by using a dry etching process.

5. The PIN photodiode according to claim 1, wherein:
    the first doped layer is an n+ α-Si: H layer, the intrinsic layer is an α-Si: H layer, the second doped layer is a p+ α-Si: H layer, and the heavily-doped region is a p++ α-Si: H layer; or
    the second doped layer is an n+ α-Si: H layer, the intrinsic layer is an α-Si: H layer, the first doped layer is a p+ α-Si: H layer, and the heavily-doped region is an n++ α-Si: H layer.

6. The PIN photodiode according to claim 1, wherein the heavily-doped region is formed through an ion implantation process.

7. The PIN photodiode according to claim 1, wherein the heavily-doped region has a shape of a groove, the groove is formed in the intrinsic layer and the second doped layer, and a portion of the cathode is arranged within the groove.

8. The PIN photodiode according to claim 6, wherein B2H6 or PH3 is used as an ion source for doping in the ion implantation process.

9. A method of manufacturing the PIN photodiode according to claim 1, comprising steps of:
depositing a plurality of layers of the PIN photodiode on a side of the source/drain electrode layer away from an active layer of the thin film transistor and patterning the plurality of layers, the plurality of layers comprising a first doped layer, a second doped layer and an intrinsic layer between the first and second doped layers, the first doped layer being providing on the source/drain electrode layer;
forming a heavily-doped region, the heavily-doped region contacting the second doped layer;
performing annealing activation treatment so as to activate doped ions;
depositing a passivation layer to at least cover the second doped layer, and patterning the passivation layer so as to form a through hole at a position in the passivation layer corresponding to the heavily-doped region; and
depositing a cathode material layer on the passivation layer above the second doped layer and patterning the cathode material layer so as to form a cathode, a portion of the cathode being arranged within the through hole so that the cathode electrically contacts or is electrically connected with the heavily-doped region.

10. The method according to claim 9, wherein the step of forming a heavily-doped region comprises:
heavily doping the second doped layer by using an ion implantation process so that the heavily-doped region is formed in the second doped layer.

11. The method according to claim 9, wherein the step of forming a heavily-doped region comprises:
patterning the intrinsic layer and the second doped layer so as to form a groove penetrating through the intrinsic layer and being partially located in the second doped layer; and
heavily doping the groove by using an ion implantation process so as to form the heavily-doped region in a form of groove.

12. The method according to claim 9, wherein the step of patterning the plurality of layers of the PIN photodiode comprises coating, developing and postbaking photoresist and performing a dry etching process so as to pattern the plurality of layers, and stripping the photoresist.

13. The method according to claim 9, wherein the first doped layer and the second doped layer of the PIN photodiode are formed respectively by using an ion implantation process.

14. The method according to claim 13, wherein
an $\alpha$-Si: H layer is deposited through a PECVD process, and is doped by using B2H6 or PH3 as an ion source so as to form a P+ $\alpha$-Si: H layer or an N+ $\alpha$-Si: H layer as the first doped layer; and
then an $\alpha$-Si: H layer is deposited through a PECVD process, and is partially doped by using PH3 or B2H6 as an ion source so as to form an N+ $\alpha$-Si: H layer or a P+ $\alpha$-Si: H layer as the second doped layer with an undoped portion of the $\alpha$-Si: H layer being used as the intrinsic layer.

15. The method according to claim 9, wherein thicknesses of the first doped layer and the second doped layer are 200 Å~700 Å respectively, and a thickness of the intrinsic layer is 5000 Å~15000 Å.

16. An X-ray detector, comprising:
a substrate;
a thin film transistor formed on the substrate, the thin film transistor comprising a gate, a gate insulation layer, an active layer and a source/drain electrode layer arranged in stack in order on the substrate;
the PIN photodiode according to claim 1; and
a scintillant material layer at least covering the PIN photodiode.

17. A method of manufacturing the X-ray detector of claim 16, comprising:
forming the thin film transistor on the substrate;
forming the PIN photodiode by the method of claim 9; and
forming the scintillant material layer to at least cover the PIN photodiode and performing a packaging process.

18. The PIN photodiode according to claim 2, wherein a surface of the second doped layer facing the cathode is provided with a textured structure.

19. The PIN photodiode according to claim 2, wherein:
the heavily-doped region has a shape of a groove, the groove is formed in the intrinsic layer and the second doped layer, and a portion of the cathode is arranged within the groove.

20. The method according to claim 9, wherein at least one of the heavily-doped region and the cathode is formed as a grid shape.

* * * * *